United States Patent
Natzle et al.

(10) Patent No.: US 6,335,261 B1
(45) Date of Patent: Jan. 1, 2002

(54) DIRECTIONAL CVD PROCESS WITH OPTIMIZED ETCHBACK

(75) Inventors: Wesley Natzle, New Paltz; Richard A. Conti, Mount Kisco; Laertis Economikos, Wappingers Falls; Thomas Ivers, Hopewell Jct.; George D. Papasouliotis, Fishkill, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/584,355

(22) Filed: May 31, 2000

(51) Int. Cl.[7] ....................................... H01L 21/00
(52) U.S. Cl. ............... 438/435; 438/221; 438/424; 438/685; 438/694; 438/696; 438/758; 438/762; 438/765; 438/775; 438/788
(58) Field of Search ..................... 438/689, 694, 438/696, 758, 762, 765, 775, 788, 221, 424, 435

(56) References Cited

U.S. PATENT DOCUMENTS

| | | |
|---|---|---|
| 5,227,191 A | 7/1993 | Nagashima |
| 5,246,885 A | 9/1993 | Braren et al. |
| 5,282,925 A | 2/1994 | Jeng et al. |
| 5,532,516 A | 7/1996 | Pasch et al. |
| 5,622,894 A | 4/1997 | Jang et al. |
| 5,636,320 A | 6/1997 | Yu et al. |
| 5,641,545 A | 6/1997 | Sandhu |
| 5,702,982 A | 12/1997 | Lee et al. |
| 5,789,818 A | 8/1998 | Havemann |
| 5,851,344 A | 12/1998 | Xu et al. |
| 5,858,876 A | 1/1999 | Chew |
| 5,869,902 A | 2/1999 | Lee et al. |
| 5,897,370 A | 4/1999 | Joshi et al. |
| 5,910,020 A | 6/1999 | Yamada |
| 5,911,113 A | 6/1999 | Yao et al. |
| 5,913,140 A | 6/1999 | Roche et al. |
| 5,953,635 A | 9/1999 | Andideh |
| 5,962,923 A | 10/1999 | Xu et al. |
| 5,963,840 A | 10/1999 | Xia et al. |
| 5,968,610 A | 10/1999 | Liu et al. |
| 5,972,192 A | 10/1999 | Dubin et al. |
| 6,030,881 A | 2/2000 | Papasouliotis et al. |
| 6,077,451 A * | 6/2000 | Takenaka et al. ............ 216/79 |

* cited by examiner

Primary Examiner—Charles Bowers
Assistant Examiner—Lisa Kilday
(74) Attorney, Agent, or Firm—Jay H. Anderson (57) ABSTRACT

A method is described for filling a high-aspect-ratio feature, in which compatible deposition and etching steps are performed in a sequence. The feature is formed as an opening in a substrate having a surface; a fill material is deposited at the bottom of the feature and on the surface of the substrate; deposition on the surface adjacent the feature causes formation of an overhang structure partially blocking the opening. The fill material is then reacted with a reactant to form a solid reaction product having a greater specific volume than the fill material. The overhang structure is thus converted into a reaction product structure blocking the opening. The reaction product (including the reaction product structure) is then desorbed, thereby exposing unreacted fill material at the bottom of the feature. The depositing and reacting steps may be repeated, with a final depositing step to fill the feature. Each sequence of depositing, reacting and desorbing reduces the aspect ratio of the feature.

20 Claims, 6 Drawing Sheets

DIRECTIONAL CVD PROCESS WITH OPTIMIZED ETCHBACK

FIELD OF THE INVENTION

This invention relates to semiconductor processing, and more particularly to an etching process to be used in combination with a high density plasma chemical vapor deposition (HDP CVD) process for filling high-aspect-ratio features.

BACKGROUND OF THE INVENTION

Figure 1A:
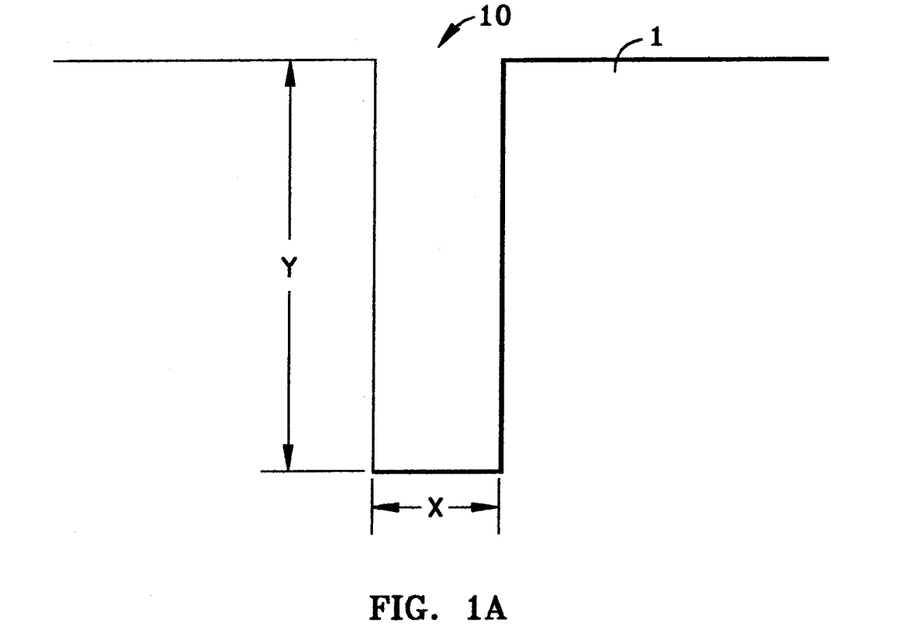
FIGS. 1A–1D schematically illustrate the problem of filling a high-aspect-ratio trench with a conventional process.

In the processing of semiconductor devices, it is often necessary to fill a high-aspect-ratio feature (such as a trench formed in a substrate) with an insulating material. An example of such a feature is trench 10 formed as an opening in substrate 1, shown in FIG. 1A. The aspect ratio AR is the ratio of depth to width of the trench, so that AR=Y:X in FIG. 1A. As device geometries continue to shrink and thermal budgets are reduced, void-free filling of high-aspect-ratio spaces (generally, AR>5:1) becomes increasingly difficult. Existing deposition processes, such as plasma-enhanced CVD (PECVD) and TEOS/ozone SACVD, either deposit more material on the upper region of a sidewall or form cusps at the entry of the feature. This results in the top part of a high-aspect-ratio structure being filled prematurely, leaving voids in the lower part.

Furthermore, as aspect ratios increase, the shape of the space becomes increasingly difficult to control; reentrant features may be formed in the space, making filling even more difficult. In addition, filling processes which depend on high-temperature film reflow (such as TEOS/ozone SACVD BPSG) are rapidly losing their utility, as advanced devices are limited to a maximum thermal budget of 650–700° C.

Figure 1B:
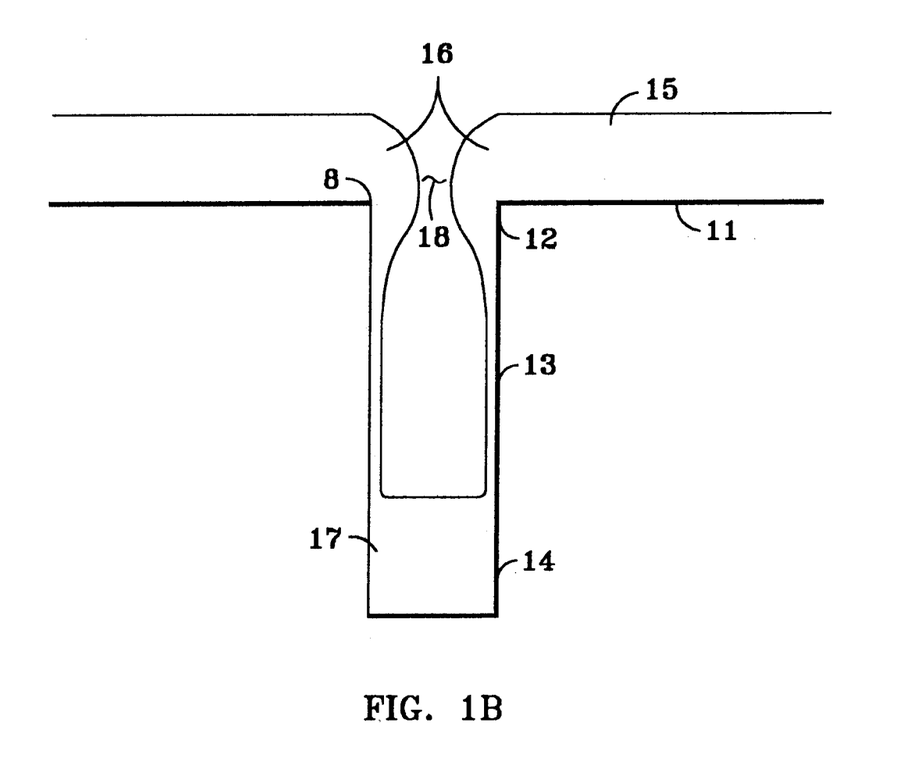

High density plasma (HDP) CVD of silicon dioxide, which is a directional CVD process, offers promise by permitting deposition of more material at the bottom of a high-AR structure than on the sidewalls thereof. However, even with this process there is more deposition on the upper part of the sidewall than the lower part. This situation is shown in FIG. 1B. The bottom region 14 of the trench is partially filled with HDP CVD oxide 17, while a layer 15 of HDP CVD oxide is deposited on the top surface 11 of the substrate. There is more oxide deposition at the upper part 12 of the sidewall than on the lower part 13.

Figure 1C:
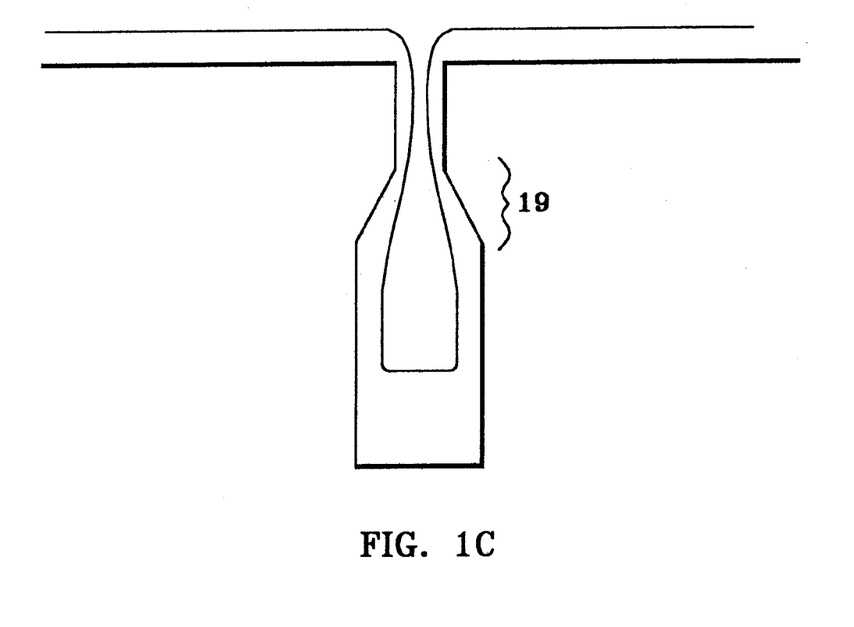

Furthermore, an overhang region 16 is formed on each side of the entrance to the trench, as a result of sputtering and redeposition reactions at the upper corners 8 of the trench (where surface 11 meets sidewall 12). As the deposition proceeds, the overhang regions grow so that the gap 18 at the entrance becomes narrower; accordingly, less material reaches the bottom of the trench. The overhang cannot be eliminated because non-directional neutral reactions, redeposition reactions and sputtering effects are inherent in the physics and chemistry of the HDP CVD process. The overhang formation problem becomes more acute as the width of the feature decreases, the AR increases, or if reentrant features are present in the structure to be filled. If a trench has a reentrant profile 19 (see FIG. 1C), the gap at the entrance to the trench may be closed before the lower region of the trench is filled.

Figure 1D:
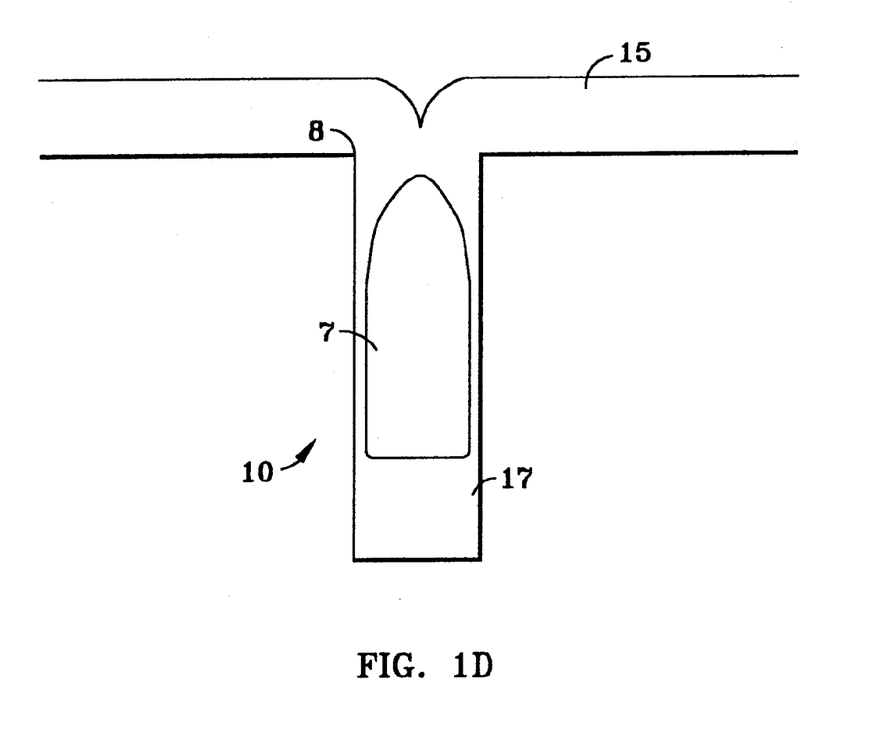

If the deposition of the HDP CVD oxide 15 proceeds until the overhangs meet and close the entrance, a void 7 will be formed in the trench 10, as shown in FIG. 1D. At this point it is necessary to etch away the oxide layer 15 to re-open the entrance, and then resume the deposition process. This is referred to as a "dep/etch/dep" technique. In general, the success of this technique depends upon the choice of an appropriate etch process. It should be noted that once the gap is re-opened by the etch process, the oxide fill 17 at the bottom of the trench is also exposed to the etch. If an isotropic chemical etch is used, the etch step may remove nearly as much material as was deposited in the previous deposition step, thereby limiting the throughput of the overall process. If inert-gas sputtering or RIE is used, the upper corners 8 of the structure may be eroded. In addition, chemical etches tend to lack selectivity, especially when they are partially isotropic; the underlying structure is thus often damaged, particularly at the corners. A wet etch process also presents tool usage and throughput problems; the wafer being processed must be removed from the deposition tool (that is, removed from vacuum) for each deposition/etch cycle. It is highly desirable for the deposition and etch processes to be integrated, either in the same chamber or in a cluster tool, to minimize the required movement of wafers.

There remains a need for a method for filling high-AR features in which repeated deposition and etching processes may be performed without removing the wafer from vacuum.

SUMMARY OF THE INVENTION

The present invention addresses the above-described need by providing a method for filling a high-aspect-ratio feature, in which compatible deposition and etching steps are performed in a sequence. The feature is formed as an opening in a substrate having a surface; the aspect ratio is the ratio of the unfilled depth of the feature to the width of the opening.

In accordance with the present invention, a fill material is deposited at the bottom of the feature and on the surface of the substrate, typically by a high-density plasma (HDP) process. Deposition on the surface adjacent the feature causes formation of an overhang structure partially blocking the opening. The fill material is then reacted with a reactant to form a solid reaction product having a greater specific volume than the fill material. As a result, the overhang structure is converted into a reaction product structure blocking the opening. The reaction product (including the reaction product structure) is then desorbed (that is, decomposed and removed), thereby exposing unreacted fill material at the bottom of the feature. The depositing step is then repeated to fill the feature.

The above-described depositing and reacting steps may be further repeated, with a final depositing step to fill the feature. Each sequence of depositing, reacting and desorbing reduces the aspect ratio of the feature; the final depositing step is performed when the aspect ratio is reduced to less than 3:1.

The method of the present invention may be practiced with a variety of fill materials, including undoped silicon oxides (USG) and doped silicon oxides such as phosphosilicate glass (PSG), borosilicate glass (BSG) and borophosphosilicate glass (BPSG). The reactant is a mixture of ammonia and hydrogen fluroide, typically in a mixture of approximately one part $NH_3$ to two parts HF.

It should be noted that the solid reaction product structure prevents the reactant from reaching the fill material at the bottom of the feature, so that unwanted etching of that fill material is minimized. Accordingly, the amount of fill material etched away from the substrate surface is greater than the amount etched away from the fill at the bottom of the feature.

The reaction product is decomposed by heating the substrate, typically to a temperature greater than 100° C. The decomposed reaction product may then be easily be removed.

During the reacting step, the solid reaction product increases in thickness until the reactant is prevented from diffusing to the underlying fill material. An unreacted layer of fill material may thus remain on the surface of the substrate after the desorbing step. An edge of this unreacted layer nearest the opening is separated from the opening, so that after a depositing/reacting/desorbing sequence the structure effectively has an opening wider than the original opening; the effective aspect ratio of the structure is thereby reduced.

Although a certain amount of unreacted fill material remains at the bottom of the feature at the end of the depositing/reacting/desorbing sequence, fill material deposited on the sidewalls of the feature is generally converted into the reaction product and subsequently removed. Accordingly, buildup of the fill material on the sidewalls is avoided.

An important advantage of this invention is that all the steps in the above-described method are performed in a vacuum chamber, so that the substrate may remain in the vacuum chamber while the method is performed.

DETAILED DESCRIPTION OF THE PREFERRED EMBODIMENTS

In a preferred embodiment of the invention, a high aspect ratio structure is filled with oxide by repeated deposition and etching processes. The deposition process is optimized to efficiently fill the bottom of the structure, while the etch process is optimized to effectively reduce the aspect ratio of the structure, as detailed below.

Deposition Process

Figure 2A:
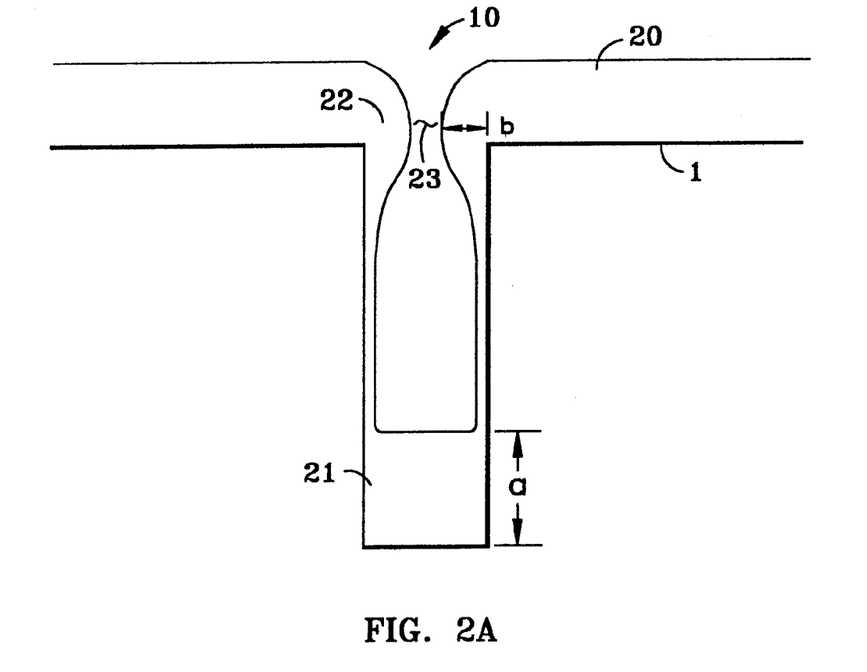
FIGS. 2A–2D illustrate steps in a trench fill process including a deposition step and an etching step which effectively reduces the aspect ratio of the trench, in accordance with the present invention.

As shown in FIG. 2A, an oxide layer 20 is deposited on substrate 1 having trench 10 formed therein. A portion 21 of the oxide fills the bottom of the trench, while an overhang 22 forms at each side of the top of the trench. The duration of the deposition step is selected so that the gap 23 between the overhangs is reduced to about 100 Å.

This deposition step is performed by high-density plasma (HDP) CVD. The term "high-density" refers to a plasma with density in the range $10^{11}$ to $10^{13}$ cm$^{-3}$, and with an ionized fraction of gas in the range 0.001 to 0.1. The process conditions are chosen to maximize deposition at the bottom of the trench relative to deposition on the upper portion of the sidewall. It will be appreciated that the precise process conditions depend upon both the structure to be filled and the deposition apparatus being used. Details of a suitable HDP CVD process are described in U.S. Pat. No. 6,030,881, "High throughput chemical vapor deposition process capable of filling high aspect ratio structures," assigned to the same assignees as the present application.

If the depth of the oxide 21 at the bottom of the trench is given by a and the extent of sidewall deposition (that is, size of the overhang) is given by b, the ratio b/a provides a measure of how quickly the trench opening is plugged by the deposition process. Generally, then, process conditions are chosen to minimize the ratio b/a, subject to the constraint of avoiding damage to the structure to be filled.

Since oxide deposition at the bottom of the trench is a result of species traveling perpendicular to the substrate surface, the depth component a can be modeled as depending on the concentration of ionized species driven by the bias voltage on the wafer. The overhang component b, in contrast, can be modeled as depending on isotropic deposition of neutral species (traveling in random directions and sticking to a surface at the impingement point). The deposition process is optimized (ratio b/a is minimized) under conditions where formation of overhang 22 is minimized. It has been found that optimal deposition conditions include a low wafer bias voltage and a high plasma density. The low bias voltage ensures that the sputtering component of the deposition is small. Ratio b/a is also dependent on other, tool-dependent conditions, such as pressure, RF power and wafer temperature.

Etching Process

At the completion of the first deposition step, the structure is as shown in FIG. 2A. An etch is then performed using a chemical oxide removal (COR) process. The object of the etch process is to lower the effective aspect ratio of the structure, by enlarging the opening at the top of the trench while minimizing etching at the bottom of the trench.

As described in more detail below, the etch process includes two distinct steps: (1) a reaction step, in which the structure is exposed to a reactant mixture, to convert the oxide fill material to a reaction product; and (2) a desorption step, in which the reaction product is decomposed and removed, to arrive at a structure with a reduced aspect ratio.

In the reaction step of the etch process, the wafer is exposed to a mixture of $NH_3$ and HF, approximately in the proportion of one part $NH_3$ to two parts HF. The reaction of this mixture with silicon dioxide yields a solid product, which is believed to be ammonium hexafluorosilicate, $(NH_4)_2SiF_6$. The solid reaction product has a specific volume approximately 3 times that of the original silicon dioxide. In particular, the reaction at the overhang 22 causes the gap 23 to be closed, so that after the gap is closed no further etching of the oxide trench fill 21 occurs. However, etching continues at the oxide layer on the upper surface of the substrate 1. The solid product slows the reaction by impeding diffusion of the $NH_3$/HF reactants through the product to the underlying oxide; accordingly, the etch reaches a self-limiting point where the solid reaction product becomes too thick to permit further etching of underlying oxide.

The interior surfaces of the trench 10 preferably are lined with a material that is not attacked by the etch process. A suitable material is silicon nitride, deposited on the interior of the trench by a low pressure CVD process. The $NH_3$/HF etch chemistry used in this embodiment selectively etches silicon dioxide relative to this silicon nitride with an etch rate ratio in the range 15:1 to 30:1.

Figure 2B:
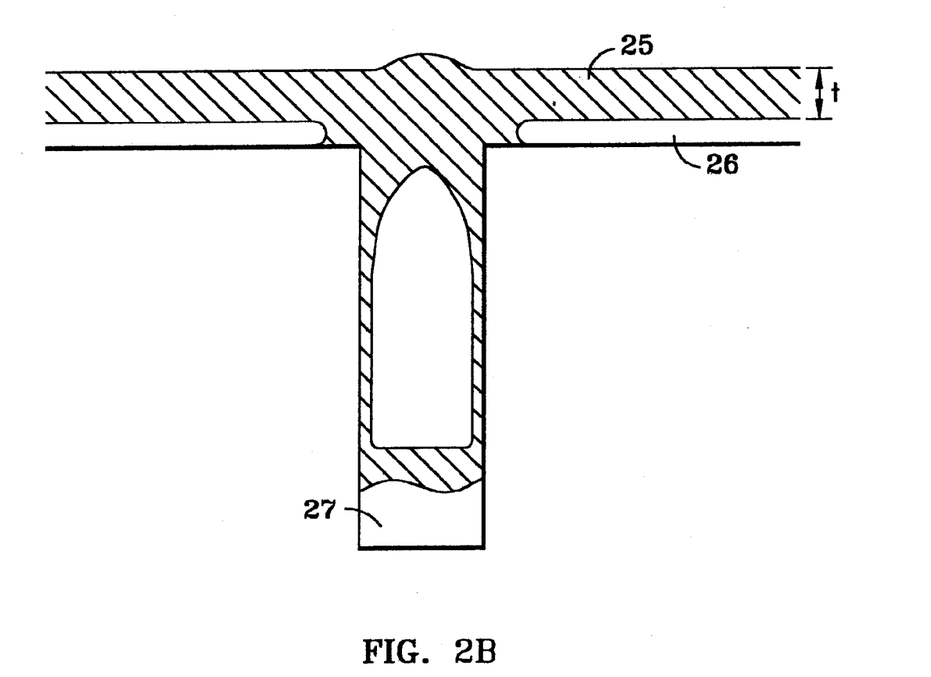

The result of the reaction step is shown in FIG. 2B. The solid reaction product 25 closes the gap at the top of the trench; the sidewall oxide is converted into reaction product, but a substantial amount 27 of the oxide trench fill remains unreacted. The top portion and overhang regions of the original oxide layer are converted into reaction product, but an underlying, unreacted oxide layer 26 remains on the substrate. Typically, the reaction self-terminates when the thickness t of reaction product layer 25 over oxide layer 26 reaches 600 to 700 Å (corresponding to 200 to 230 Å of etched silicon dioxide).

Figure 2C:
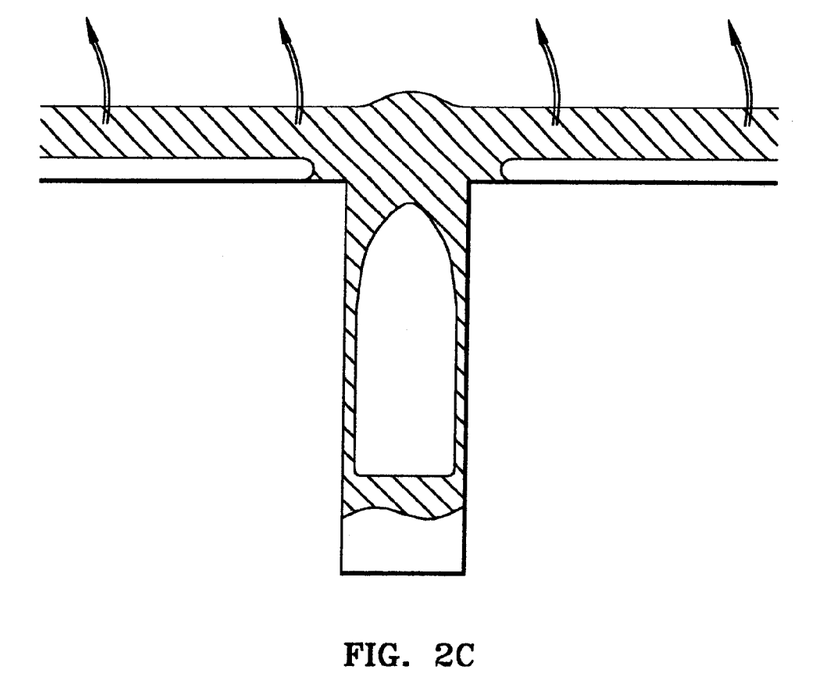
Figure 2D:
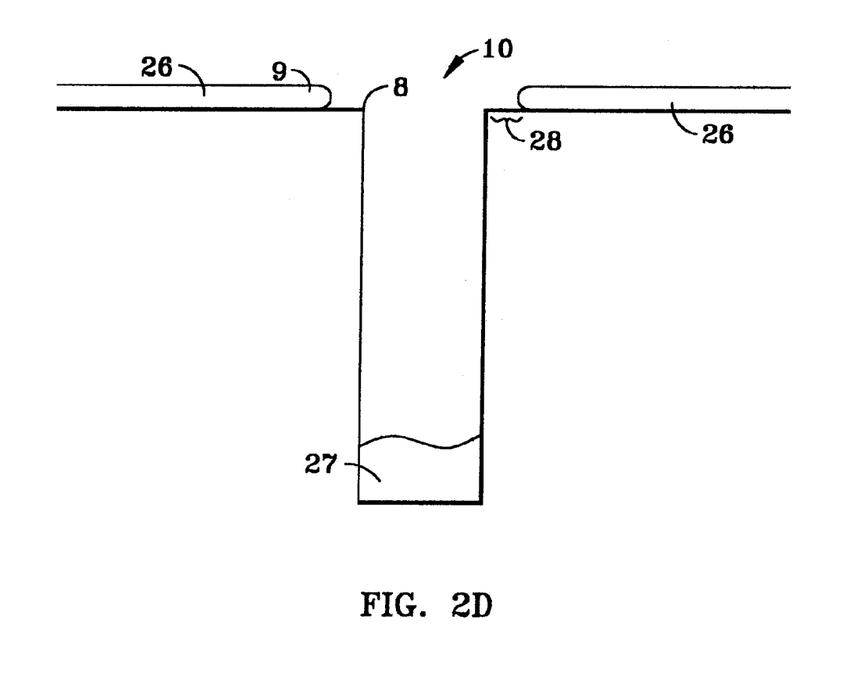

In the desorption step, the wafer is heated to a temperature of at least 100° C., so that the reaction product 25 decomposes into gaseous components, which are then pumped away (see FIG. 2C). It has been found that a 100° C. temperature results in a satisfactory desorption rate, while the desorption is expected to be faster at higher temperatures. The trench 10 is thus re-opened, with the unreacted oxide fill 27 at the bottom. The unreacted oxide layer 26 remains on the top of the substrate, with its edge 9 pulled back from the trench corner 8 (see FIG. 2D).

It should be noted that this etch process has only gaseous reactants, and is therefore compatible with a vacuum chamber such as is used for the HDP CVD process. In addition, the etching reaction proceeds without a plasma, so that damage to the structure is minimized. Furthermore, this process is superior to wet etching processes (such as etching the oxide by aqueous HF), since a wet process is unable to remove the oxide from the overhang region without also etching a similar amount of oxide from the bottom of the trench structure.

Figure 3A:
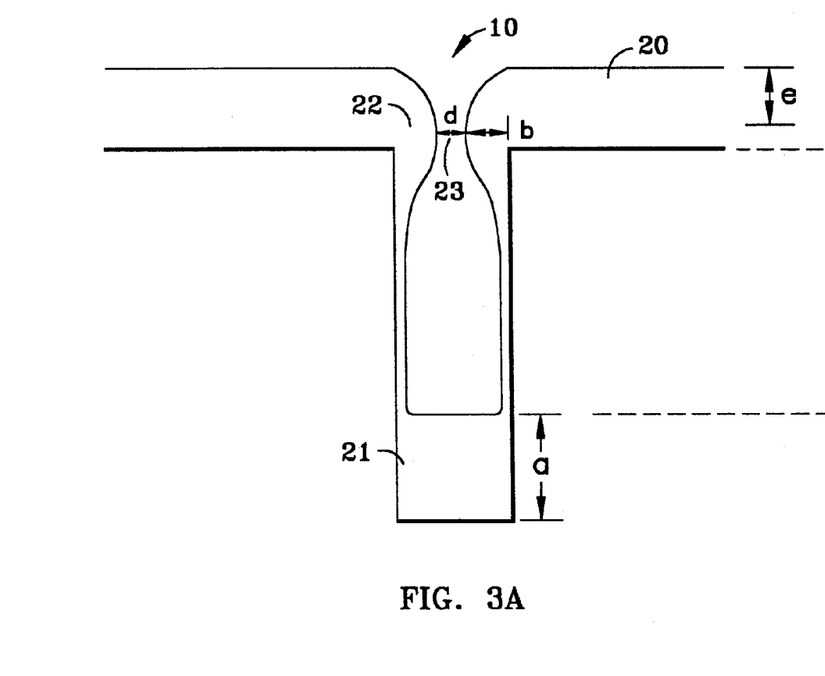
FIGS. 3A and 3B show a side-by-side comparison of a partially filled trench, before (FIG. 3A) and after (FIG. 3B) the process illustrated in FIGS. 2A–2D.
Figure 3B:
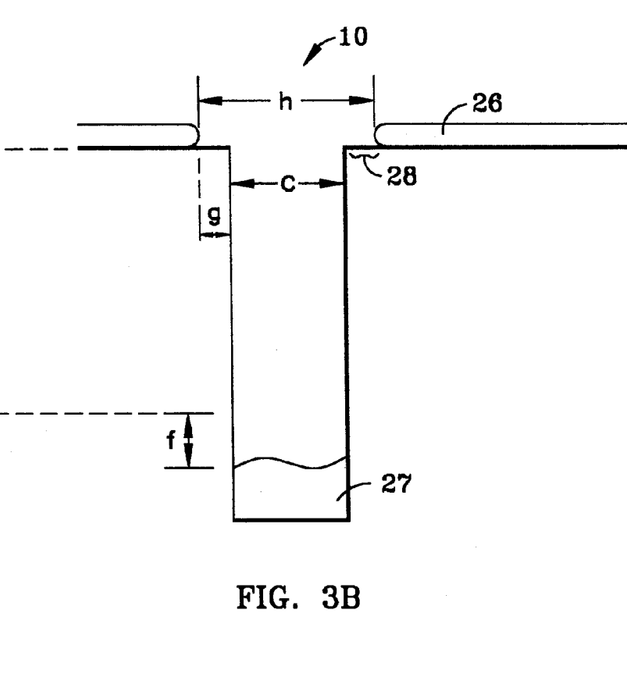

FIGS. 3A and 3B show the trench 10 with the HDP CVD oxide before and after the etch process, respectively. Before the etch process, the overhangs 22, each with a lateral dimension b, reduce the gap 23 to dimension d, so that $d=c-2b$. The bottom of the trench is filled with oxide 21 to a depth a. After the etch process, the oxide fill 27 at the bottom is reduced in depth by an amount f. The overhangs are removed, and the oxide on the top surface is pulled back a distance g on each side of the trench, so that the opening (seen by the oxide in the next deposition step) becomes $h=c+2g$. The thickness of the oxide on top of the substrate is reduced by an amount e.

The etch process effectively reduces the aspect ratio of the trench. This is due to two factors. First, the effective width of the opening is increased as a result of the pullback of the edge 9 of the oxide layer by distance g from the corner 8 of the trench. In the subsequent deposition step, neutral species (traveling in random directions) will deposit both at the corner 8 and the layer edge 9. It should be noted that this has the effect of delaying growth of overhangs, because neutral species landing at edge 9 and on the exposed portion 28 of the substrate would otherwise build up at corner 8 and contribute to overhang growth. It has been found that the optimum pullback distance g is the distance which causes the deposition at edge 9 to be faster than at corner 8 in the ratio h/c.

The second factor arises from the etch reaction product 25 filling the gap 23. This causes etching of the oxide fill 21 to cease (because reactants are then prevented from reaching the bottom of the trench), while etching of the oxide 20 on the top surface continues. Accordingly, etch distance e is greater than etch distance f. This means that the overall depth of the structure (the distance between the upper surface of the oxide on top of the substrate and the oxide surface inside the trench) is reduced during the etch (compare FIGS. 3A and 3B). As a result, the aspect ratio is less in FIG. 3B than in FIG. 3A, even in the absence of lateral pullback of the oxide.

A second deposition step may now be performed on the structure shown in FIG. 3B. This second deposition step may have a longer duration than the first deposition step (and thus deposit more oxide), because the aspect ratio has been reduced relative to the original structure shown in FIG. 1A. Stated another way, the pullback of the oxide layer permits deposition in the bottom of the structure to proceed for a longer period of time than in the first deposition step.

Protocol for Repeated Dep/Etch Sequence

A general procedure for an optimized dep/etch sequence is as follows:

(1) The combination of deposition and etching processes is repeated until the aspect ratio is reduced to 3:1 or less.

(2) In each deposition process, the deposition is stopped when the gap between overhangs (FIG. 2A, gap 23) is reduced to 100 Å.

(3) In each etch process, the etch is permitted to proceed to its self-limiting point (which gives maximum lateral pullback of the oxide layer 26 on the substrate). However, for very narrow geometries (gaps less than about 600 Å) the etch time may be controlled so that only the overhang is removed.

(4) When the aspect ratio is reduced to 3:1 or less, a final HDP CVD process, at low RF bias, is used to fill the structure.

Process optimization experiments are performed using a combination of prediction and observation. The HDP deposition process has been modeled using Monte Carlo techniques; commercially available codes are capable of modeling the process for a given structure to calculate a process time so as to meet guideline (2) above. This calculated deposition time is then used as a starting point for optimization experiments. After the first deposition step, and after each dep/etch sequence, the profile of the oxide surface (particularly the gap at the top of the structure) is examined by SEM. Once the oxide profile from the previous sequence is known, HDP modeling can again be used to predict the duration of the next deposition step.

Figure 4:
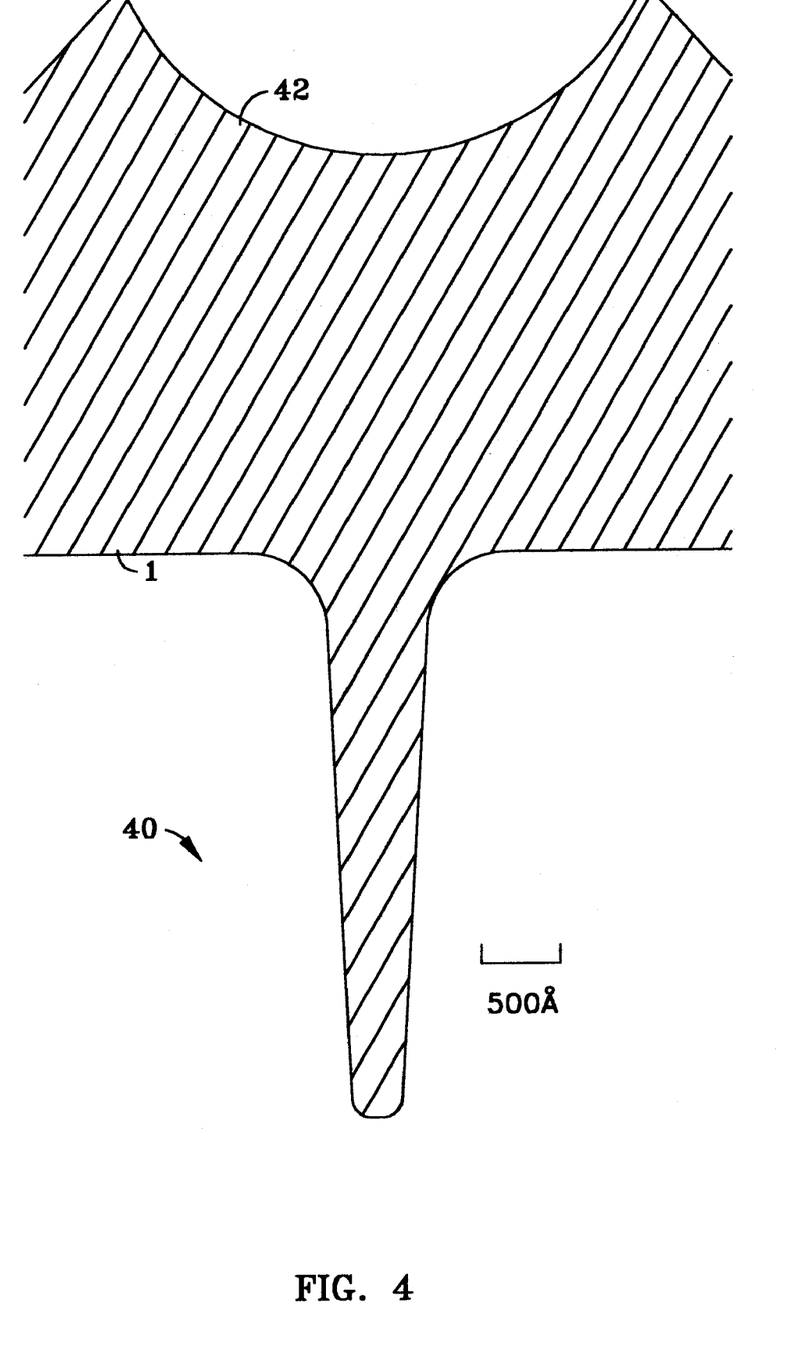
FIG. 4 is a scale drawing of an example of a high-AR trench filled in accordance with the process of the present invention.

FIG. 4 is a scale drawing taken from an SEM of a trench filled according to the above-described method. Trench 40, formed in substrate 1, has a depth of 3300 Å and is approximately 300 Å wide at the bottom (its narrowest point). The trench was filled with USG material 42 using four deposition/etch sequences, followed by a fifth and final deposition process. In each deposition, 1000 Å of USG was deposited at a rate of 3000 Å/minute; each etch removed 360 Å. In the final deposition, 4000 Å of USG was deposited at a rate of 5800 Å/minute.

The combination of deposition and etch processes of the present invention offers the advantage of tailoring the interaction between the processes (for example, the interaction between deposition conditions to produce a gap of given size and COR etch conditions to simultaneously plug the gap and clear away oxide from the sidewall), to arrive at an oxide profile that permits efficient filling of the structure. In particular, the chemical oxide removal (COR) process is highly selective and self-terminating, thereby enabling controlled removal of thin layers of oxide and avoiding unintended removal of oxide from the bottom of the structure. Conventional sputtering, RIE and wet etch processes, by contrast, do not offer the combination of high selectivity and self-termination and thus offer no opportunity for tailoring the interaction between the deposition and etch processes.

Furthermore, it will be appreciated that the combination of the HDP CVD process and the low pressure etch process enables integration of the etch chamber with the deposition so that a single wafer handler may be used to load both chambers. Accordingly, a repeated sequence of deposition/ etch/deposition processes may be efficiently performed without breaking vacuum.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for filling a feature formed as an opening in a substrate having a surface, the feature having a bottom, the method comprising the steps of:

depositing a fill material at the bottom of the feature and on the surface of the substrate, where deposition on the surface adjacent the feature causes formation of an overhang structure partially blocking the opening;

reacting the fill material with a reactant to form a solid reaction product having a greater specific volume than the fill material, so that the overhang structure is converted into a reaction product structure blocking the opening;

desorbing the reaction product including the reaction product structure, thereby exposing unreacted fill material at the bottom of the feature; and repeating said depositing step to fill the feature.

2. A method according to claim 1, wherein said depositing step comprises a high-density plasma CVD process.

3. A method according to claim 2, wherein the high-density plasma is characterized by an electron density in the range $10^{11}$ to $10^{13}$ cm$^{-3}$ and an ionized fraction of gas in the range 0.001 to 0.1.

4. A method according to claim 1, wherein said repeating step further comprises repeating said reacting step and said desorbing step after said depositing step is repeated, and performing a final depositing step to fill the feature.

5. A method according to claim 1, wherein said desorbing step further comprises:

decomposing the reaction product; and removing the decomposed reaction product.

6. A method according to claim 5, wherein said decomposing is performed by heating the substrate.

7. A method according to claim 6, wherein the substrate is heated to a temperature of at least 100° C.

8. A method according to claim 1, wherein formation of the reaction product structure prevents the reactant from reaching the fill material at the bottom of the feature.

9. A method according to claim 1, wherein an unreacted layer of fill material remains on the surface of the substrate after said desorbing step, said unreacted layer having an edge nearest the opening, said edge being separated from the opening.

10. A method according to claim 1, wherein all the steps of said method are performed in a vacuum chamber, and said substrate remains in the vacuum chamber while the method is performed.

11. A method according to claim 10, wherein fill material is deposited on sidewalls of the feature in said depositing step, converted to the solid reaction product in said reacting step and removed from the sidewalls in said desorbing step.

12. A method according to claim 1, wherein the feature has an aspect ratio characterized as the ratio of an unfilled depth of the feature to a width of the opening, so that a sequence of said depositing step, said reacting step and said desorbing step reduces the aspect ratio.

13. A method according to claim 4, wherein said depositing step, said reacting step and said desorbing step comprise a sequence, and a plurality of sequences are performed before the final depositing step.

14. A method according to claim 13, wherein the feature has an aspect ratio characterized as the ratio of an unfilled depth of the feature to a width of the opening, so that each sequence of said depositing step, said reacting step and said desorbing step reduces the aspect ratio, and the final depositing step is performed when the aspect ratio is reduced to less than 3:1.

15. A method according to claim 1, wherein the fill material deposited on the surface of the substrate has a first thickness reduced by a first amount in said reacting step and said desorbing step, and the fill material deposited at the bottom of the feature has a second thickness reduced by a second amount in said reacting step and said desorbing step, and the second amount is less than the first amount.

16. A method according to claim 1, wherein said depositing step is terminated when an unblocked portion of the opening is reduced in width to about 100 Å.

17. A method according to claim 1, wherein the fill material comprises silicon dioxide.

18. A method according to claim 1, wherein the fill material is selected from the group consisting of silicon dioxide, PSG, BSG and BPSG.

19. A method according to claim 1, wherein the reactant comprises ammonia and hydrogen fluoride.

20. A method according to claim 19, wherein the ammonia and hydrogen fluoride are in a proportion of approximately one part ammonia to two parts hydrogen fluoride.

* * * * *

UNITED STATES PATENT AND TRADEMARK OFFICE
CERTIFICATE OF CORRECTION

PATENT NO. : 6,335,261 B1  Page 1 of 1
APPLICATION NO. : 09/584355
DATED : January 1, 2002
INVENTOR(S) : Natzle et al.

It is certified that error appears in the above-identified patent and that said Letters Patent is hereby corrected as shown below:

On title page Item [73]
In the "Assignee" section, please add --Novellus Systems, Inc.--

Signed and Sealed this

Eighteenth Day of September, 2007

JON W. DUDAS
*Director of the United States Patent and Trademark Office*